(12) United States Patent
Kim et al.

(10) Patent No.: US 10,749,042 B2
(45) Date of Patent: Aug. 18, 2020

(54) VERTICAL MEMORY DEVICE

(71) Applicant: SAMSUNG ELECTRONICS CO., LTD., Suwon-si (KR)

(72) Inventors: Hyuk Kim, Seongnam-si (KR); Dae Hyun Jang, Hwaseong-si (KR); Seung Pil Chung, Seoul (KR); Sung Il Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/400,443

(22) Filed: May 1, 2019

(65) Prior Publication Data
US 2019/0259881 A1 Aug. 22, 2019

Related U.S. Application Data

(63) Continuation of application No. 15/849,094, filed on Dec. 20, 2017, now Pat. No. 10,319,864.

(30) Foreign Application Priority Data

Jun. 21, 2017 (KR) .................. 10-2017-0078531

(51) Int. Cl.
*H01L 29/792* (2006.01)
*H01L 29/10* (2006.01)
(Continued)

(52) U.S. Cl.
CPC .... *H01L 29/7926* (2013.01); *H01L 27/11556* (2013.01); *H01L 27/11565* (2013.01);
(Continued)

(58) Field of Classification Search
CPC ..................... H01L 27/11578; H01L 29/7926
See application file for complete search history.

(56) References Cited

U.S. PATENT DOCUMENTS 9,165,924 B2 10/2015 Cho et al.
9,219,075 B1 12/2015 Lai
(Continued)

FOREIGN PATENT DOCUMENTS

KR 10-2011-0120536 A 11/2011
KR 10-2017-0128996 A 11/2017

*Primary Examiner* — Farun Lu
(74) *Attorney, Agent, or Firm* — Sughrue Mion, PLLC

(57) ABSTRACT

A vertical memory device and a method of manufacturing such device are provided. The vertical memory device may include a plurality of gate electrode layers stacked in a cell region of a semiconductor substrate; a plurality of upper isolation insulating layers dividing an uppermost gate electrode layer among the plurality of gate electrode layers, extending in a first direction; a plurality of vertical holes arranged to have any two adjacent vertical holes to have a uniform distance from each other throughout the cell region and including a plurality of channel holes penetrating through the plurality of gate electrode layers disposed between the plurality of upper isolation insulating layers and a plurality of first support holes penetrating through the plurality of upper insulating layers; a plurality of channel structures disposed in the plurality of channel holes; and a plurality of first support structures disposed in the plurality of first support holes.

19 Claims, 20 Drawing Sheets

(51) Int. Cl.
   *H01L 29/66*       (2006.01)
   *H01L 27/11556*    (2017.01)
   *H01L 27/11578*    (2017.01)
   *H01L 21/28*       (2006.01)
   *H01L 27/11565*    (2017.01)
   *H01L 27/11582*    (2017.01)
   *H01L 27/11573*    (2017.01)

(52) U.S. Cl.
   CPC .. *H01L 27/11578* (2013.01); *H01L 27/11582* (2013.01); *H01L 29/1041* (2013.01); *H01L 29/40117* (2019.08); *H01L 29/66666* (2013.01); *H01L 29/66833* (2013.01); *H01L 27/11573* (2013.01)

(56) References Cited

U.S. PATENT DOCUMENTS

| | | | |
|---|---|---|---|
| 9,368,646 | B2 | 6/2016 | Kim et al. |
| 9,406,692 | B2 | 8/2016 | Lee |
| 9,455,155 | B2 | 9/2016 | Lai |
| 9,520,485 | B2 | 12/2016 | Lue |
| 2011/0291172 | A1* | 12/2011 | Hwang ............ H01L 27/11578 257/314 |
| 2015/0129878 | A1 | 5/2015 | Shin et al. |
| 2015/0194435 | A1* | 7/2015 | Lee .................. H01L 27/11575 257/329 |
| 2016/0005745 | A1 | 1/2016 | Kim et al. |
| 2016/0126252 | A1 | 5/2016 | Tsuda et al. |
| 2016/0343726 | A1 | 11/2016 | Yune |
| 2017/0330887 | A1 | 11/2017 | Kim et al. |

* cited by examiner

VERTICAL MEMORY DEVICE

CROSS-REFERENCE TO RELATED APPLICATION

This is a continuation of U.S. application Ser. No. 15/849,094 filed Dec. 20, 2017, which claims priority from Korean Patent Application No. 10-2017-0078531, filed on Jun. 21, 2017, in the Korean Intellectual Property Office, the disclosure of which is incorporated herein by reference in its entirety.

BACKGROUND

1. Field

Apparatuses and methods consistent with example embodiments relate to a vertical memory device.

2. Description of Related Art

Electronic products have vastly decreased in size over time, while still being expected to process high-capacity data. Therefore, a degree of integration for semiconductor memory devices used in electronic products have also increased. In order to increase the degree of integration in semiconductor memory devices, a method of manufacturing vertical memory devices in which memory cells having a vertical transistor structure are stacked, rather than a conventional planar transistor structure, has been proposed.

SUMMARY

One or more example embodiments provide a vertical memory device in which a defect related to an etching process of channel holes is remedied.

According to an aspect of an example embodiment, a vertical memory device may include a plurality of gate electrode layers stacked in a cell region of a semiconductor substrate; a plurality of upper isolation insulating layers dividing an uppermost gate electrode layer among the plurality of gate electrode layers, the plurality of upper isolation insulating layers being disposed to extend in a first direction and be spaced apart from each other; a plurality of vertical holes wherein any two adjacent vertical holes of the plurality of vertical holes have a uniform distance from each other throughout the cell region, the plurality of vertical holes including a plurality of channel holes penetrating through the plurality of gate electrode layers disposed between the plurality of upper isolation insulating layers and a plurality of first support holes penetrating through at least a portion of the plurality of upper isolation insulating layers; a plurality of channel structures disposed in the plurality of channel holes; and a plurality of first support structures disposed in the plurality of first support holes. The plurality of channel holes and the plurality of first support holes may have the same diameter, while the plurality of channel structures may include materials that are different from the plurality of first support structures.

According to an aspect of an example embodiment, a vertical memory device may include a plurality of gate electrode layers and a plurality of mold insulating layers, alternately stacked in a cell region of a semiconductor substrate; a plurality of isolation insulating layers dividing an uppermost gate electrode layer, among the plurality of gate electrode layers, into a plurality of regions, the plurality of isolation insulating layers being disposed to extend in a first direction and be spaced apart from each other; and a plurality of vertical structures penetrating through the plurality of gate electrode layers in a direction perpendicular to an upper surface of the semiconductor substrate and disposed to have uniform distances among the plurality of vertical structures. Intermediate gate electrode layers among the plurality of gate electrode layers may be integrally formed on the same plane. The plurality of isolation insulating layers may be disposed on the intermediate gate electrode layers. The plurality of vertical structures may include a plurality of channel structures disposed to be spaced apart from the plurality of isolation insulating layers, and a plurality of first support structures in contact with the plurality of isolation insulating layers.

According to an aspect of an example embodiment, a vertical memory device may include a semiconductor substrate including a cell region; a plurality of gate electrode layers stacked in the cell region of the semiconductor substrate; upper trenches dividing an uppermost gate electrode layer, among the plurality of gate electrode layers, into a plurality of regions, the upper trenches being disposed to extend in a first direction and being disposed at periodic intervals from each other in a second direction; lower trenches dividing a lowermost gate electrode layer, among the plurality of gate electrode layers, into a plurality of regions, the lower trenches being disposed to extend in the first direction and being disposed at the periodic intervals from each other in the second direction; and a plurality of vertical holes penetrating through the plurality of gate electrode layers in a direction perpendicular to an upper surface of the semiconductor substrate and disposed to have uniform distances among the plurality of vertical holes in the cell region. The plurality of vertical holes may include a plurality of support holes disposed in positions overlapping the upper trenches and the lower trenches, and a plurality of channel holes disposed to be spaced apart from the upper trenches and the lower trenches.

BRIEF DESCRIPTION OF THE DRAWINGS

The above and/or other aspects will be more clearly understood from the following detailed description of example embodiments, when taken in conjunction with the accompanying drawings, in which.

DETAILED DESCRIPTION

Hereinafter, example embodiments of the present disclosure will be described with reference to the attached drawings.

Figure 1:
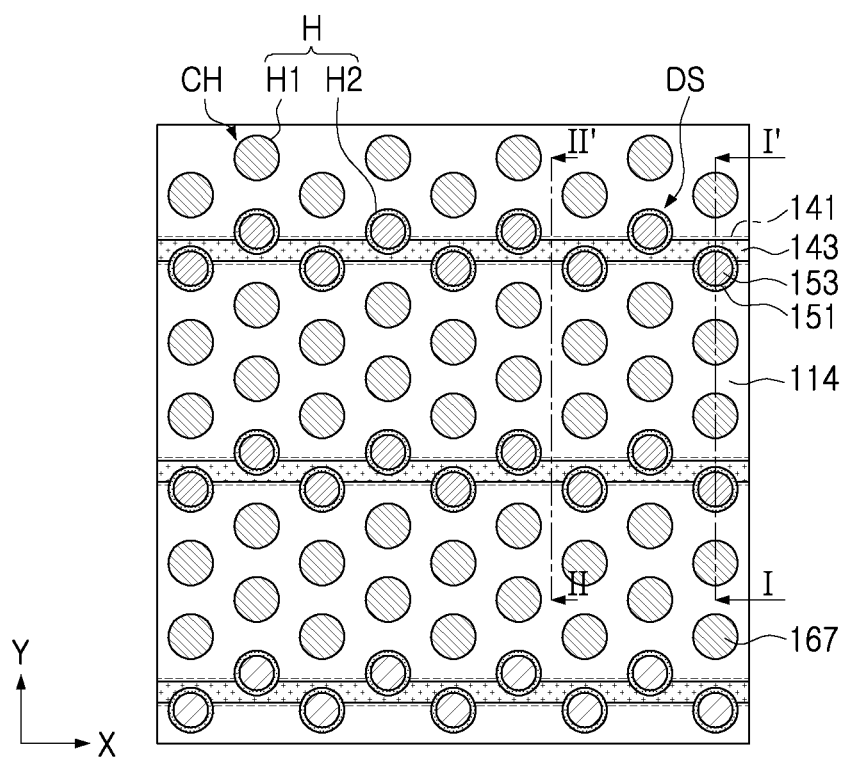
FIG. 1 is a schematic top view of a vertical memory device according to an example embodiment.
Figure 2:
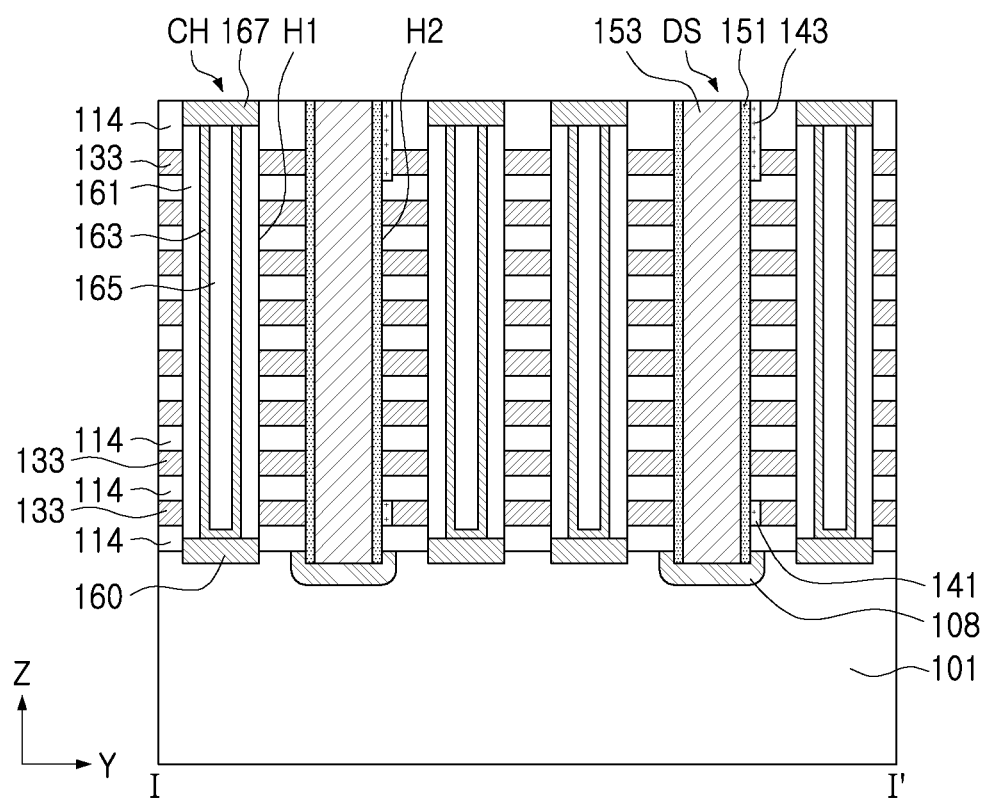
FIGS. 2 and 3 are schematic cross-sectional views of a vertical memory device according to an example embodiment.
Figure 3:
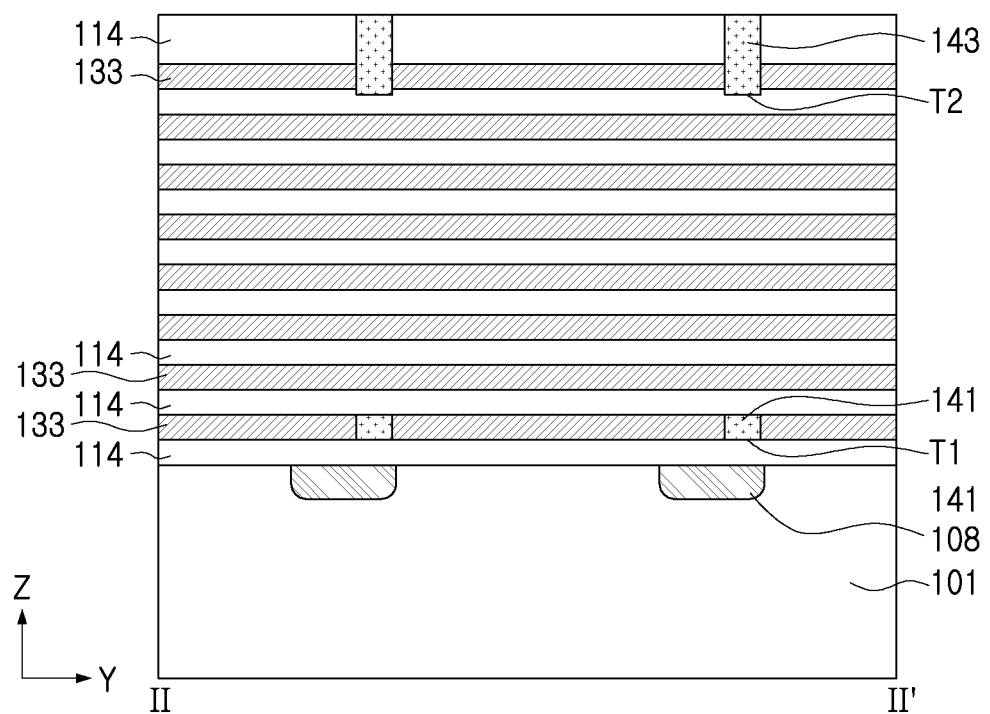

FIG. 1 is a schematic top view of a vertical memory device according to an example embodiment. FIGS. 2 and 3 are schematic cross-sectional views of the vertical memory device illustrated in FIG. 1. FIG. 2 is a cross-sectional view taken along line I-I' of FIG. 1, while FIG. 3 is a cross-sectional view taken along line II-II' of FIG. 1.

With reference to FIGS. 1 to 3, a vertical memory device according to an example embodiment may include a semiconductor substrate 101, a plurality of common source regions 108, a plurality of mold insulating layers 114, a plurality of gate electrode layers 133, a plurality of lower isolation insulating layers 141, a plurality of upper isolation insulating layers 143, a plurality of vertical holes H, a plurality of channel structures CH, and a plurality of support structures DS.

The semiconductor substrate 101 may include a cell region in which a plurality of memory cells are formed and a peripheral circuit region disposed on a periphery of the cell region and including peripheral circuits controlling the memory cells formed therein.

FIGS. 1 to 3 illustrate a structure of the vertical memory device corresponding to a portion of the cell region of the semiconductor substrate 101. In an entirety of the cell region of the semiconductor substrate 101, the same structure as that illustrated in FIGS. 1 to 3 may be repeated.

In detail, the semiconductor substrate 101 may include a group IV semiconductor, a group III-V compound semiconductor, or a group II-VI compound semiconductor. The semiconductor substrate 101 may include a common source region 108 extending in a first direction (e.g., an X-axis direction). In detail, the common source region 108 may be provided as an impurity region doped with an n-type impurity in an upper portion of the semiconductor substrate 101.

The plurality of gate electrode layers 133 and the plurality of mold insulating layers 114 may be alternately stacked on the semiconductor substrate 101. The plurality of gate electrode layers 133 and the plurality of mold insulating layers 114 may form a gate structure together.

The plurality of lower isolation insulating layers 141 may divide a lowermost gate electrode layer 133 into a plurality of regions and may be disposed, for example, in a plurality of first trenches T1 extending in the first direction. A first trench T1 may be referred to as a lower trench. The lowermost gate electrode layer 133 may be divided into the plurality of regions by the plurality of lower isolation insulating layers 141 extending in the first direction, while the plurality of regions may be electrically isolated from each other. The plurality of lower isolation insulating layers 141 may be disposed to have a specific interval therebetween in a second direction (e.g., a Y-axis direction) intersecting the first direction. Upper surfaces of the plurality of lower isolation insulating layers 141 may be coplanar with an upper surface of the lowermost gate electrode layer 133. The plurality of regions of the lowermost gate electrode layer 133 may be referred to as a plurality of lower selection lines. In an example embodiment, the plurality of lower isolation insulating layers 141 may be omitted.

The plurality of upper isolation insulating layers 143 may divide an uppermost gate electrode layer 133 into a plurality of regions and may be disposed, for example, in a plurality of second trenches T2 extending in the first direction. The second trench T2 may be referred to as an upper trench. The uppermost gate electrode layer 133 may be divided into the plurality of regions by the plurality of upper isolation insulating layers 143 extending in the first direction, while the plurality of regions may be electrically isolated from each other. The plurality of upper isolation insulating layers 143 may be disposed to have a specific interval therebetween in the second direction intersecting the first direction. The plurality of regions of the uppermost gate electrode layer 133 may be referred to as a plurality of upper selection lines. The plurality of second trenches T2 may divide not only the uppermost gate electrode layer 133, but also an uppermost mold insulating layer 114 into a plurality of regions. In other words, the plurality of upper isolation insulating layers 143 may divide the uppermost mold insulating layers 114 into a plurality of regions. Upper surfaces of the plurality of upper isolation insulating layers 143 may be coplanar with an upper surface of the uppermost mold insulating layer 114. The plurality of upper isolation insulating layers 143 and the plurality of lower isolation insulating layers 141 may be disposed in positions overlapping each other.

Each of intermediate gate electrode layers 133 excluding the lowermost gate electrode layer 133 and the uppermost gate electrode layer 133 may not be divided in an entirety of the cell region of the semiconductor substrate 101. The intermediate gate electrode layers 133 may be integrally formed on the same level in a vertical direction on the same plane in the entirety of the cell region.

The intermediate gate electrode layers 133 excluding the lowermost gate electrode layer 133 and the uppermost gate electrode layer 133 may be referred to as word lines. The word lines may be integrally formed on the same level in a vertical direction on the same plane in the entirety of the cell region.

The vertical memory device according to an example embodiment may include a plurality of vertical holes H penetrating through the plurality of gate electrode layers 133 in a direction perpendicular to an upper surface of the semiconductor substrate 101 (e.g., a Z-axis direction) to be extended to an upper portion of the semiconductor substrate 101 and regularly arranged to have an equal interval therebetween (e.g., any two adjacent vertical holes having a uniform distance between each other) in the entirety of the cell region.

The plurality of vertical holes H may be arranged to have a hexagonal lattice pattern or a hexagonal packed pattern in which three vertical holes H disposed adjacent to each other form vertices of an equilateral triangle.

The plurality of vertical holes H may include a plurality of channel holes H1 penetrating through a plurality of gate electrode layers 133 disposed between the plurality of upper isolation insulating layers 143 and may include a plurality of first support holes H2 penetrating through at least a portion of the plurality of upper isolation insulating layers 143. The plurality of channel holes H1 and the plurality of first support holes H2 have the same diameter. The plurality of first support holes H2 may be disposed to have a zigzag form along the plurality of upper isolation insulating layers 143. In other words, the plurality of first support holes H2 may be disposed at alternating distances away from the plurality of upper isolation insulating layers 143.

The plurality of channel structures CH may be disposed in the plurality of channel holes H1, while the plurality of first support structures DS may be disposed in the plurality of first support holes H2. The plurality of first support structures DS may be disposed to have a zigzag form along the plurality of upper isolation insulating layers 143.

The plurality of first support structures DS may overlap the plurality of the upper isolation insulating layers 143 and the plurality of the lower isolation insulating layers 141.

The plurality of channel structures CH may include materials different from the plurality of first support structures DS. Each of the plurality of channel structures CH may include an epitaxial layer 160, a gate dielectric layer 161 disposed on the epitaxial layer 160, a channel layer 163 disposed on a side wall of the gate dielectric layer 161, an insulating layer 165 filling an internal space of the channel layer 163, and a drain pad 167 in contact with the channel layer 163. The epitaxial layer 160 may include a single-crystalline semiconductor material, while the channel layer 163 and the drain pad 167 may include a polycrystalline semiconductor material. The gate dielectric layer 161 may include a blocking layer, a charge storage layer, and a tunneling layer, sequentially stacked from a side surface of the channel hole H1. The gate dielectric layer 161 may be referred to as an information storage layer. The tunneling layer may be in contact with the channel layer 163. In detail, the tunneling layer may include a silicon oxide. The charge storage layer may trap an electric charge and may include a silicon nitride. The blocking layer may include a high-k dielectric layer.

Each of the plurality of first support structures DS may include a conductive layer 153 in contact with the semiconductor substrate 101 and an insulating layer 151 interposed between the conductive layer 153 and the plurality of gate electrode layers 133. The conductive layer 153 may be connected to the common source region 108. The insulating layer 151 may include a silicon oxide, while the conductive layer 153 may include tungsten (W).

FIGS. 4 to 10 are views illustrating a method of manufacturing a vertical memory device illustrated in FIGS. 1 to 3. FIGS. 4 to 10 include a top view and a cross-sectional view illustrating main operations of a method of manufacturing the vertical memory device and illustrate a portion of a cell region of the vertical memory device.

Figure 4:
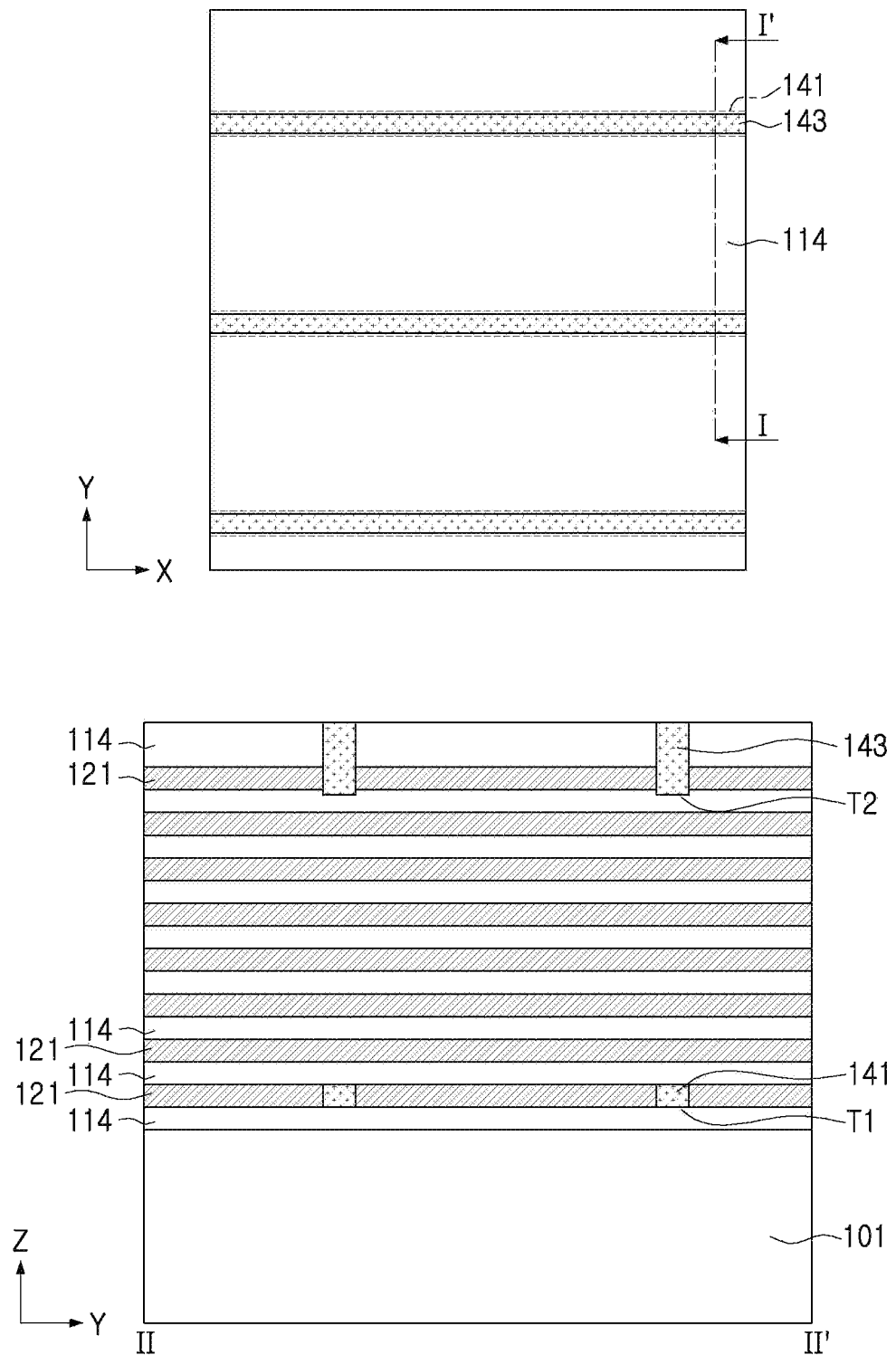
FIGS. 4 to 10 are views illustrating a method of manufacturing a vertical memory device illustrated in FIGS. 1 to 3.

With reference to FIG. 4, a plurality of mold insulating layers 114 and a plurality of sacrificial layers 121 may be alternately stacked in the cell region of a semiconductor substrate 101. A lowermost sacrificial layer 121 may be divided by a plurality of lower isolation insulating layers 141, while an uppermost sacrificial layer 121 may be divided by a plurality of upper isolation insulating layers 143.

A lowermost mold insulating layer 114 and a lowermost sacrificial layer 121 may be formed on the semiconductor substrate 101. Subsequently, a plurality of first trenches T1 extending in a first direction (e.g., an X-axis direction) may be formed in such a manner that the lowermost sacrificial layer 121 is partially etched using at least one of a photolithography process and an etching process. Subsequently, lower isolation insulating layers 141 filling first trenches T1 may be formed using at least one of a deposition process and a planarization process.

Additionally, mold insulating layers 114 and sacrificial layers 121 may be alternately stacked. Subsequently, for example, a plurality of second trenches T2 extending in the first direction may be formed in such a manner that an uppermost mold insulating layer 114 and the uppermost sacrificial layer 121 are partially etched using at least one of the photolithography process and the etching process. Subsequently, upper isolation insulating layers 143 filling the second trenches T2 may be formed using the deposition process and the planarization process. The plurality of first trenches T1 and the plurality of second trenches T2 may be formed in positions overlapping each other.

Figure 5:
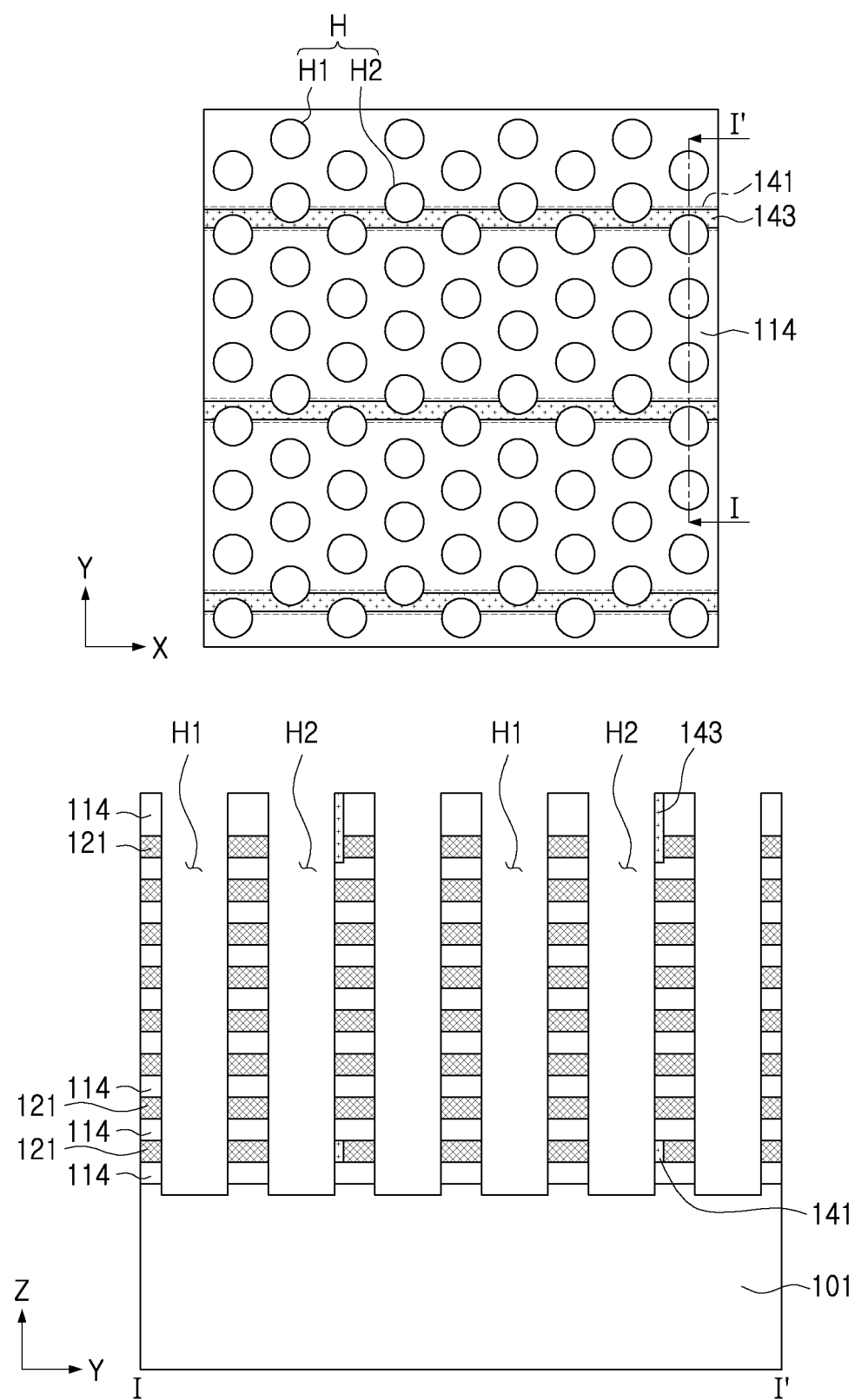

With reference to FIG. 5, a plurality of vertical holes H penetrating through the plurality of mold insulating layers 114 and the plurality of sacrificial layers 121 in a direction perpendicular to an upper portion of the semiconductor substrate 101 (e.g., a Z-axis direction) may be formed using at least one of the photolithography process and the etching process. The plurality of vertical holes H may have the same size and may be regularly arranged to have an equal interval therebetween in an entirety of the cell area. The plurality of vertical holes H may be disposed periodically to have a uniform interval therebetween in the entirety of the cell region.

The plurality of vertical holes H may be arranged to have a hexagonal packed pattern in which three vertical holes disposed adjacent to each other are disposed at vertices of an equilateral triangle. The plurality of vertical holes H may include channel holes H1 not penetrating through a lower isolation insulating layer 141 and an upper isolation insulating layer 143, but penetrating through the plurality of mold insulating layers 114 and the plurality of sacrificial layers 121 and may include first support holes H2 penetrating through the lower isolation insulating layer 141 and the upper isolation insulating layer 143. The plurality of vertical holes H may include the channel holes H1 disposed in positions not overlapping the lower isolation insulating layer 141 and the upper isolation insulating layer 143 when viewed from above (e.g., in a reverse Z-axis direction) and may include the first support holes H2 disposed in positions overlapping the lower isolation insulating layer 141 and the upper isolation insulating layer 143.

The channel holes H1 may be disposed to have a zigzag form between the upper isolation insulating layers 143, while the first support holes H2 may be disposed to have a zigzag form along the upper isolation insulating layers 143. For example, the plurality of channel holes H1 may be disposed in between two adjoining upper isolation insulating layers and at alternating distances away from the plurality of upper isolation insulating layers 143.

Figure 6:
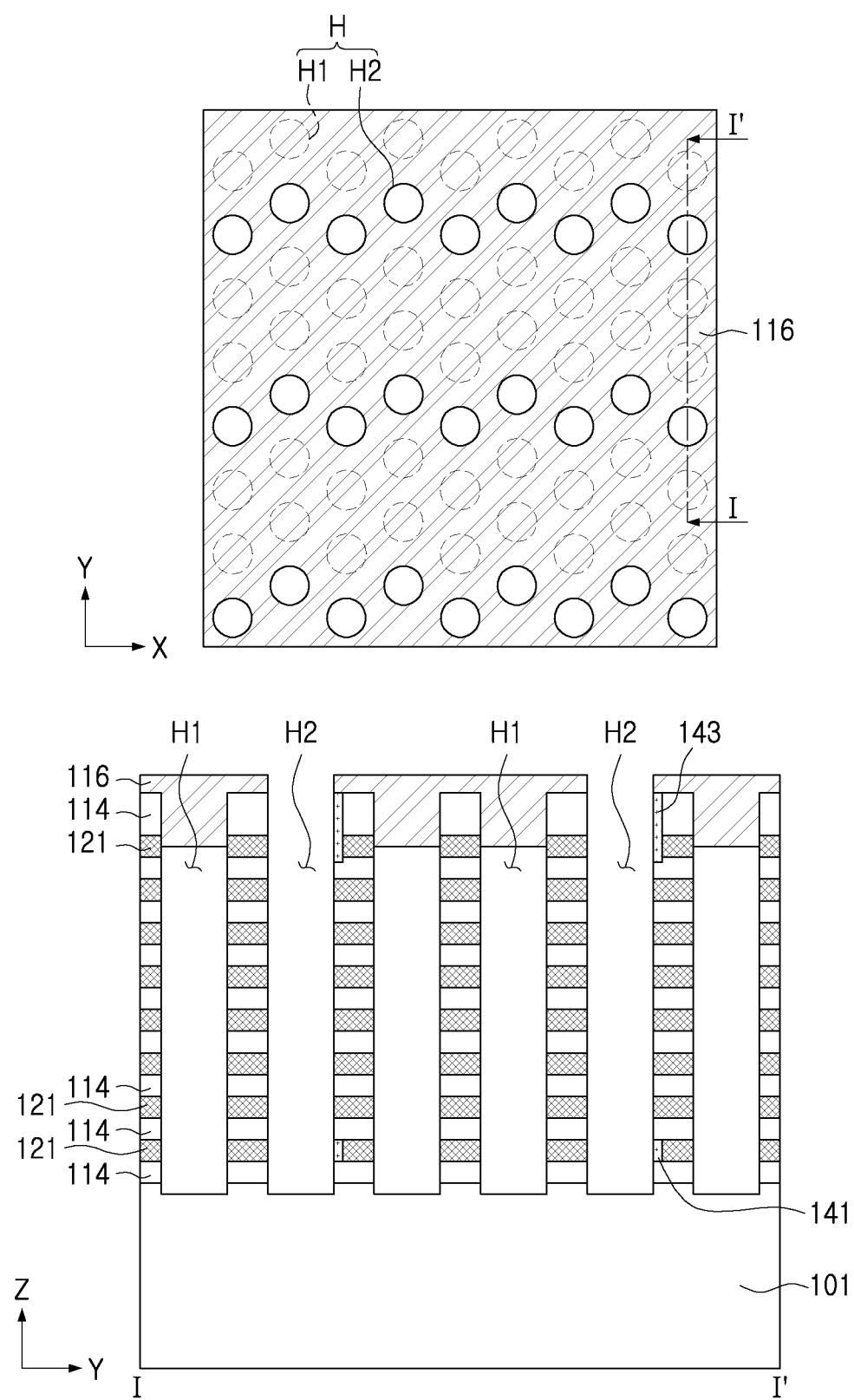

With reference to FIG. 6, a mask pattern 116 may be formed on the uppermost mold insulating layer 114. The mask pattern 116 may include openings exposing the first support holes H2. The mask pattern 116 may be formed to encapsulate only an upper portion of the channel holes H1.

After a mask layer is formed using a spin coating process, a photoresist pattern including openings corresponding to locations of the first support holes H2 may be formed using the photolithography process. Subsequently, the mask pattern 116 may be formed in such a manner that the mask layer is etched using the etching process. The photoresist pattern may be removed during the etching process. For example, the mask layer may be formed using a spin-on-hardmask (SOH). In an example embodiment, a silicon oxynitride (SiON) layer may further be formed between the mask layer and the photoresist pattern.

Figure 7:
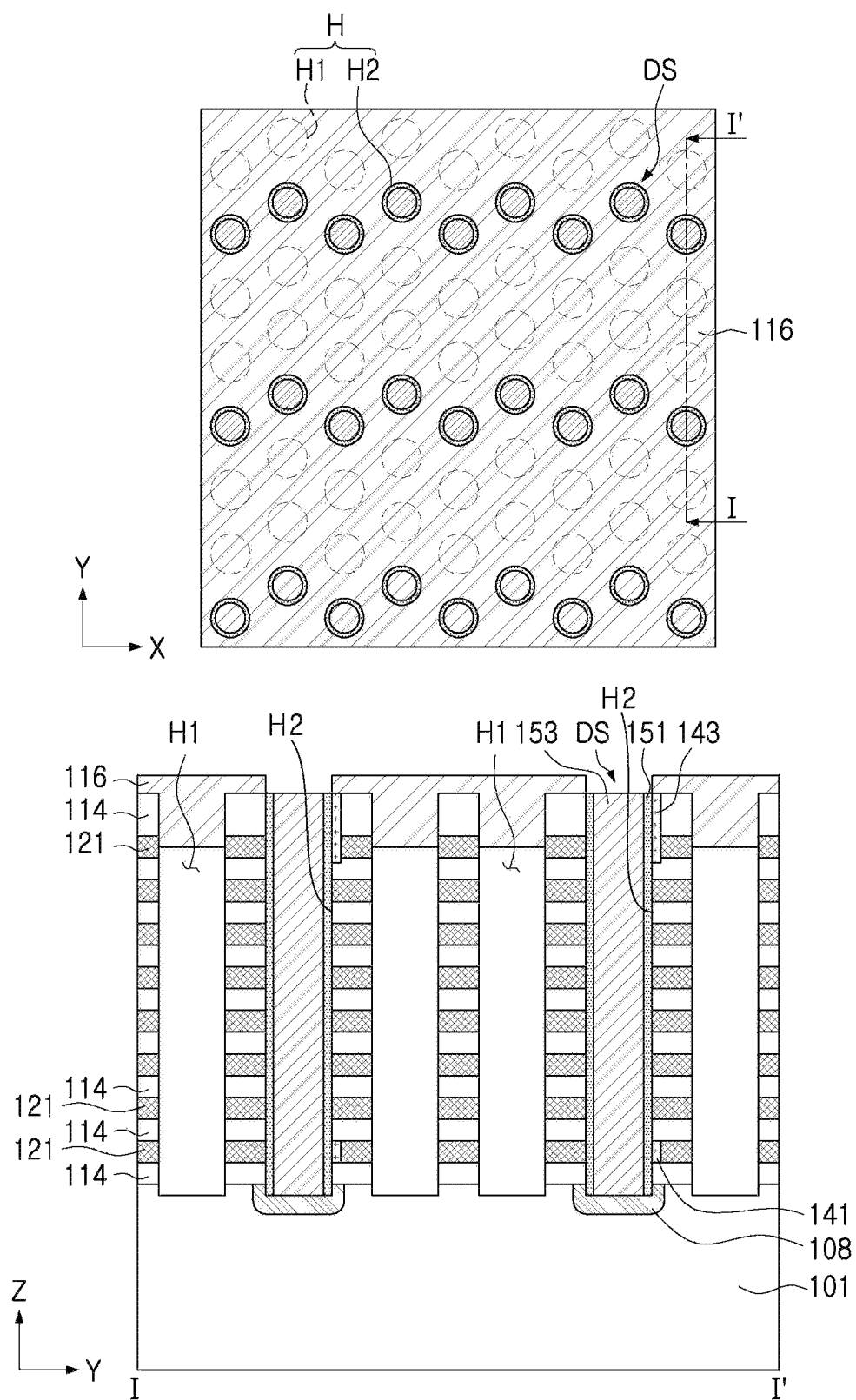

With reference to FIG. 7, a plurality of support structures DS may be formed in the first support holes H2. The plurality of support structures DS may include an insulating layer 151 and a conductive layer 153. A common source region 108 may be formed in an upper portion of the semiconductor substrate 101 below the support structures DS.

First of all, the insulating layer 151 may be formed on a side wall of the first support holes H2 using at least one of an atomic layer deposition (ALD) process and the etching process. The insulating layer 151 may include a silicon oxide. Subsequently, common source regions 108 may be formed by ion-implanting an n-type impurity into the upper portion of the semiconductor substrate 101 through the first support holes H2. A heat treatment process may be performed after an ion implantation process described above. The common source regions 108 may be formed to have a zigzag line shape extending in the first direction. At least a portion of the common source regions 108 may overlap the lower isolation insulating layers 141.

Subsequently, the conductive layer 153 may be formed in the remainder of a space of the first support holes H2 using at least one of the deposition process (e.g., the ALD process or a chemical vapor deposition (CVD) process) and the etching process. The conductive layer 153 may include W.

The plurality of support structures DS may be disposed to have a zigzag form along the upper isolation insulating layers 143.

Figure 8:
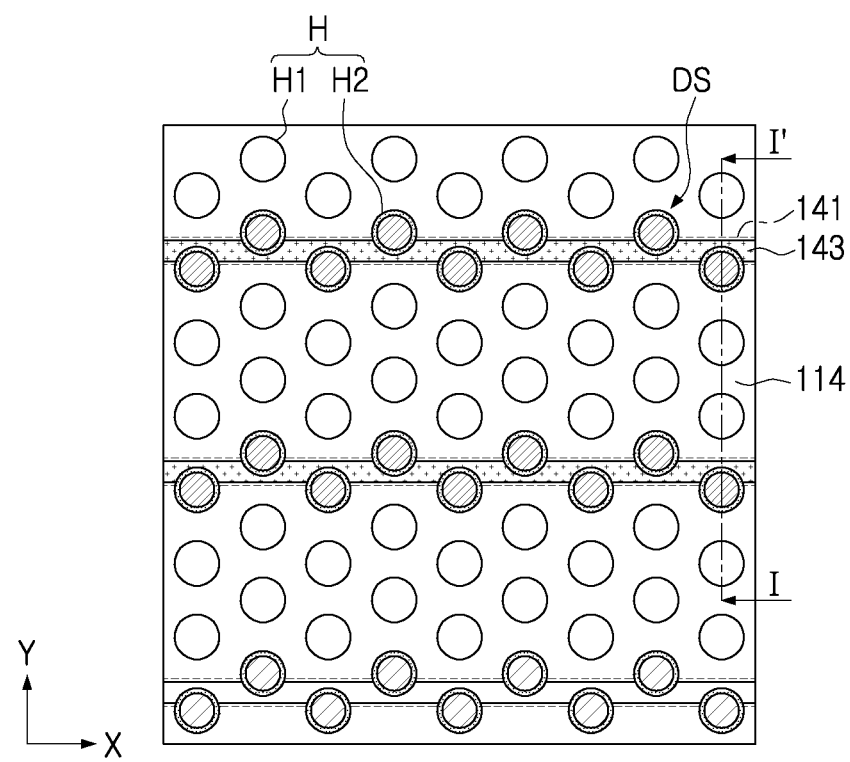
Figure 8:
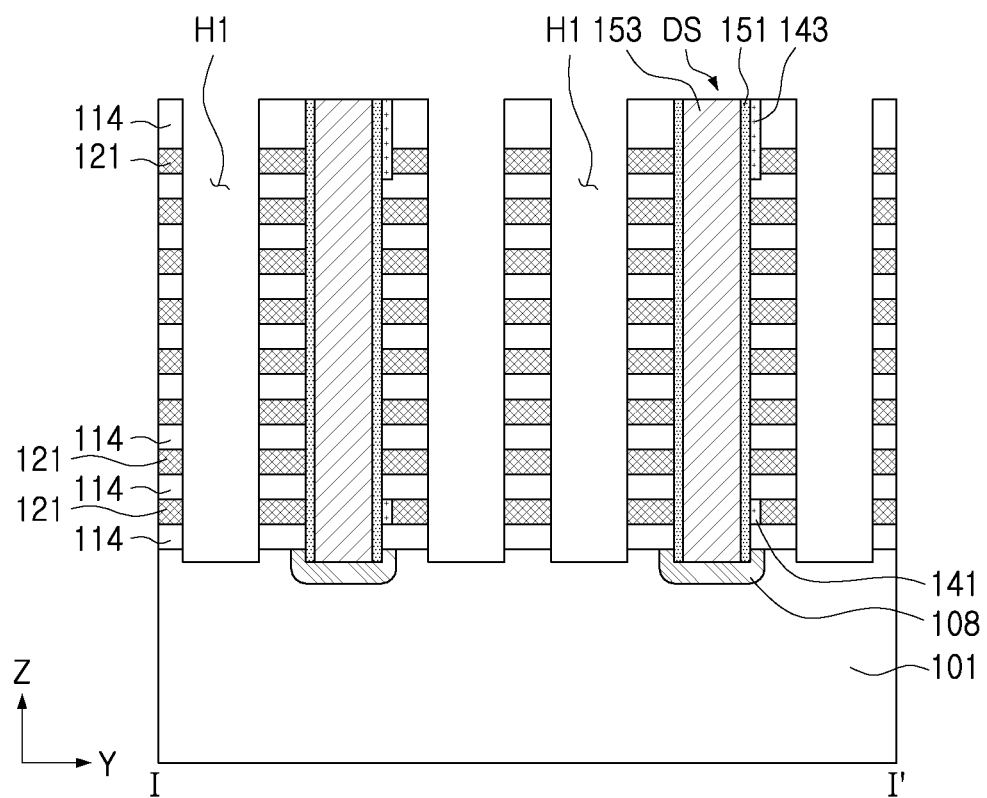

With reference to FIG. 8, the mask pattern 116 may be removed. Thus, the semiconductor substrate 101 may be exposed through the channel holes H1. In a case in which the mask pattern 116 is formed using the SOH, the mask pattern 116 may be removed using an asking process.

Figure 9:
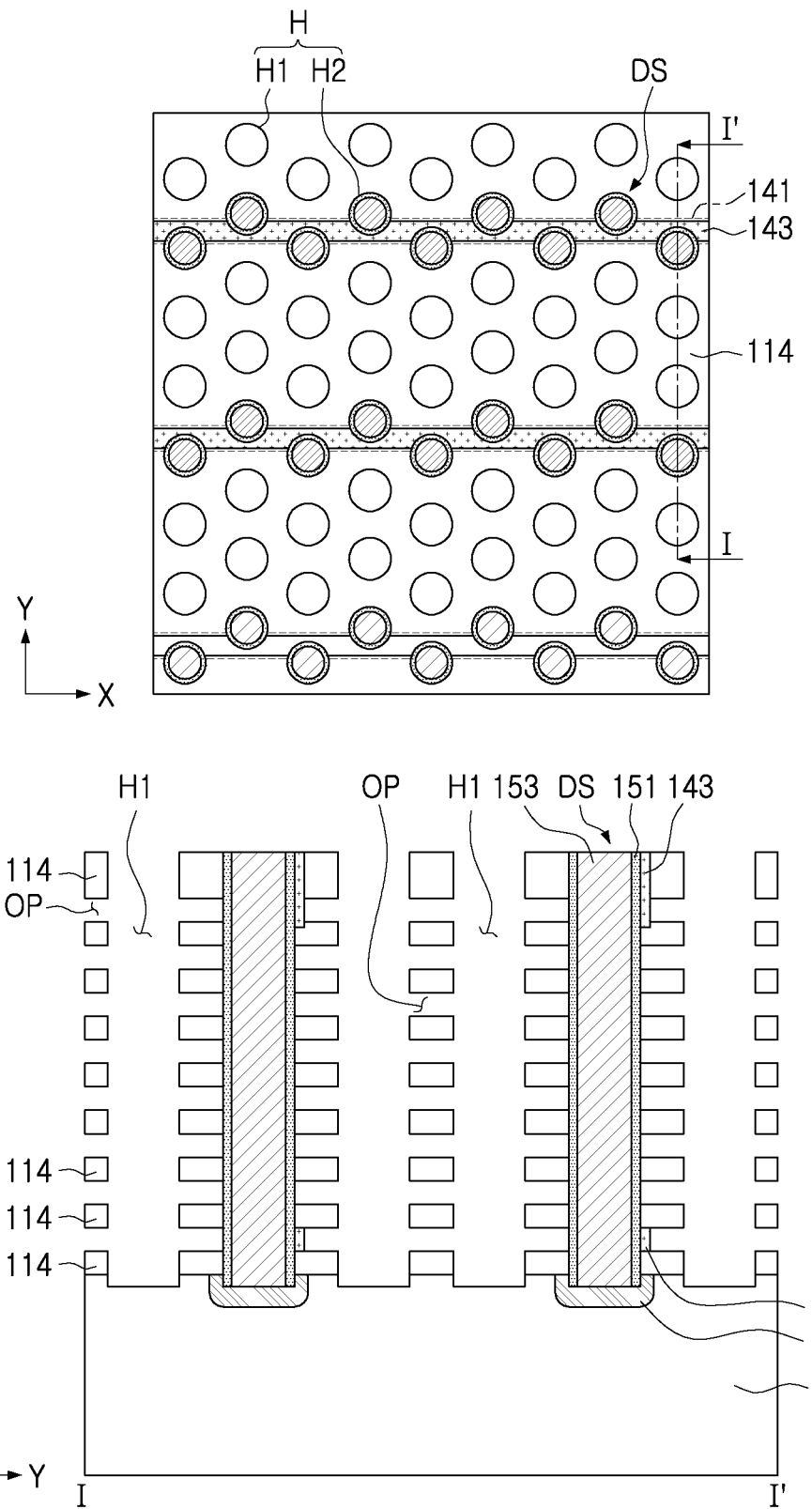

With reference to FIG. 9, the plurality of sacrificial layers 121 may be removed. The plurality of sacrificial layers 121 exposed by the channel holes H1 may be removed using a wet etching process, thereby forming horizontal openings OP between the plurality of mold insulating layers 114. In a case in which the plurality of sacrificial layers 121 are provided as a silicon nitride, the plurality of sacrificial layers 121 may be removed using a phosphoric acid solution.

The plurality of support structures DS may support a mold insulating layer 114 after the plurality of sacrificial layers 121 are removed.

Side walls of the plurality of support structures DS may be partially exposed by the horizontal openings OP. In addition, side surfaces of the lower isolation insulating layers 141 and the upper isolation insulating layers 143 may be partially exposed by the horizontal openings OP.

Figure 10:
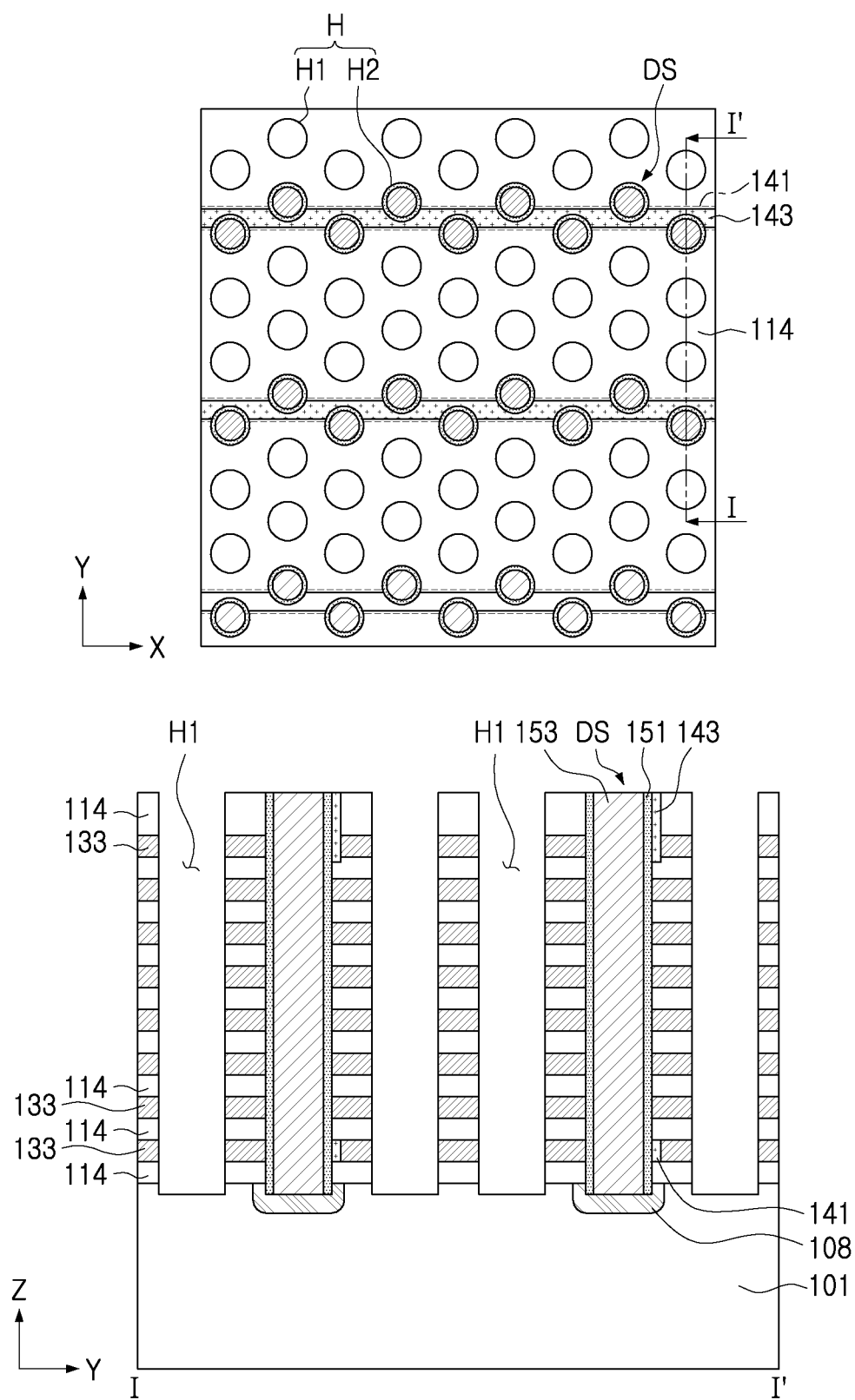

With reference to FIG. 10, gate electrode layers 133 may be formed in the horizontal openings OP.

The gate electrode layers 133 may include at least one among polycrystalline silicon, metallic silicide, a metallic nitride, and a metal. The metallic silicide may include at least one selected from a group consisting of cobalt (Co), nickel (Ni), hafnium (Hf), platinum (Pt), W, and titanium (Ti). The metal may include W. The metallic nitride may include at least one among tungsten nitride (WN), tantalum nitride (TaN), and titanium nitride (TiN).

With reference to FIG. 2, channel structures CH may be formed in the channel holes H1. An epitaxial layer 160 may be formed in the upper portion of the semiconductor substrate 101 exposed by the channel holes H1 using a selective epitaxial growth (SEG) process. An upper surface of the epitaxial layer 160 may be formed to be lower than a lower surface of the lowermost gate electrode layer 133. The epitaxial layer 160 may be formed after the process described with reference to FIG. 9 is completed. Subsequently, gate dielectric layers 161 may be formed in the channel holes H1, and the channel layers 163 may be formed on a side wall of the gate dielectric layers 161. The channel layers 163 may be in contact with the epitaxial layer 160. To this end, the etching process allowing the upper surface of the epitaxial layer 160 to be exposed may be performed by removing a portion of the gate dielectric layers 161 before the channel layers 163 are formed. Subsequently, insulating layers 165 filling the remainder of a space of the channel holes H1 may be formed, and drain pads 167 in contact with the channel layers 163 may be formed. The epitaxial layer 160 may be omitted. In this case, the channel layers 163 may be in direct contact with the semiconductor substrate 101.

The gate dielectric layer 161 may include a blocking layer, a charge storage layer, and a tunneling layer, sequentially stacked from the side surface of the channel holes H1. The gate dielectric layer 161 may be referred to as an information storage layer. The tunneling layer may be in contact with the channel layer 163. The tunneling layer may include, for example, a silicon oxide. The charge storage layer may be provided as a charge trapping layer or a floating gate conductive layer. For example, the charge storage layer may include a silicon nitride. The charge storage layer may include a quantum dot or a nanocrystal. In this case, the quantum dot or the nanocrystal may include a conductive material, such as a metal or microparticles of a semiconductor material. The blocking layer may include a high-k dielectric layer. In this case, the high-k dielectric layer refers to a dielectric material having a dielectric constant higher than that of a silicon oxide film. For example, the high-k dielectric layer may be provided as one among aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The channel layers 163 may include a semiconductor material, such as polycrystalline silicon or single-crystalline silicon. The semiconductor material may be undoped or doped with p-type or n-type impurities.

Figure 11:
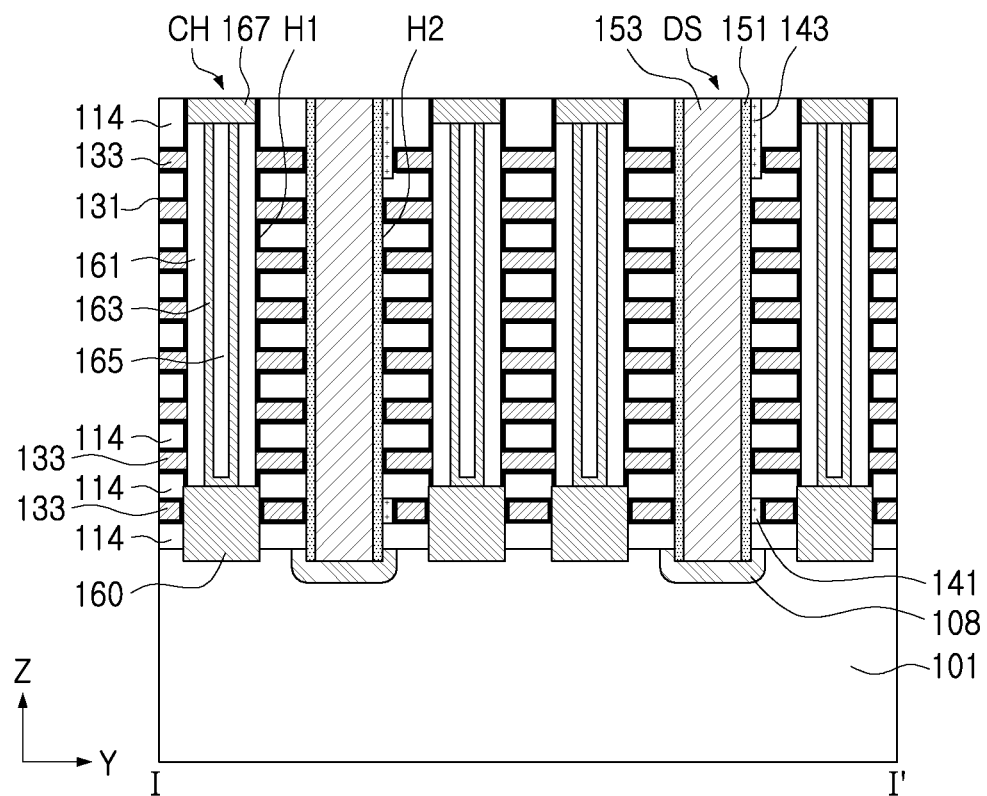
FIGS. 11 and 12 are schematic cross-sectional views of a vertical memory device according to an example embodiment.
Figure 12:
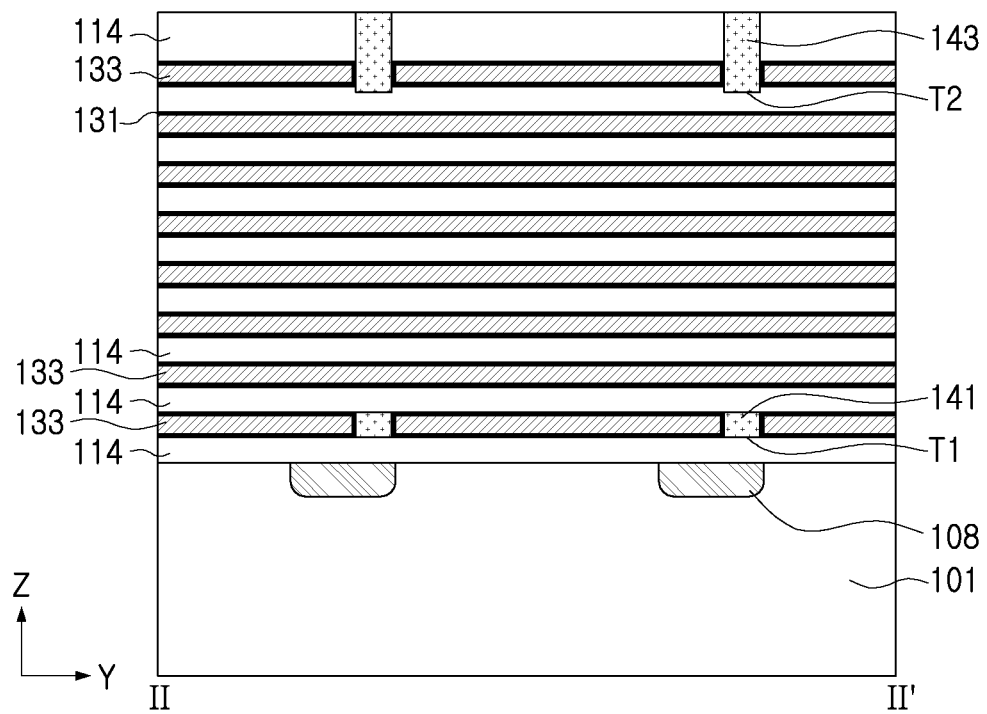

FIGS. 11 and 12 are schematic cross-sectional views of a vertical memory device according to an example embodiment. FIG. 11 is a cross-sectional view corresponding to FIG. 2, while FIG. 12 is a cross-sectional view corresponding to FIG. 3.

The vertical memory device illustrated in FIGS. 11 and 12 will be described based on the differences between the vertical memory device illustrated in FIGS. 11 and 12 and the vertical memory device illustrated in FIGS. 2 and 3.

In the case of the vertical memory device illustrated in FIGS. 11 and 12, an upper surface of an epitaxial layer 160 may be disposed to be higher than an upper surface of a lowermost gate electrode layer 133, in a manner different from the vertical memory device illustrated in FIGS. 2 and 3. In addition, the vertical memory device illustrated in FIGS. 11 and 12 may further include an insulating layer 131 interposed between a plurality of gate electrode layers 133 and a plurality of mold insulating layers 114. The insulating layer 131 may extend between mold insulating layers 114 and channel structures CH. The insulating layer 131 may also be interposed between the lowermost gate electrode layer 133 and the epitaxial layer 160 and between the lowermost gate electrode layer 133 and a lower isolation insulating layer 141. The insulating layer 131 may also be interposed between an uppermost gate electrode layer 133 and an upper isolation insulating layer 143.

Figure 13:
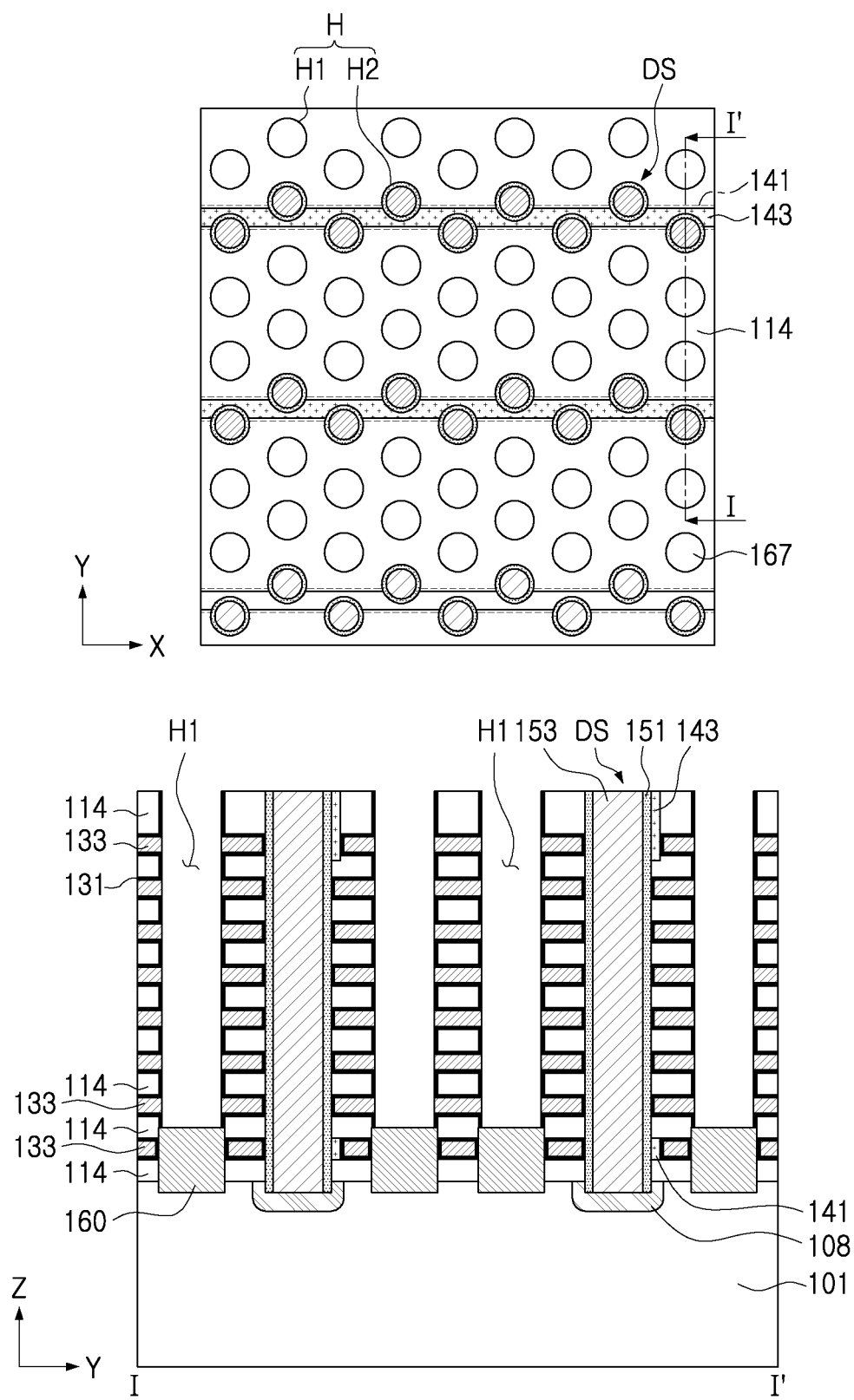
FIG. 13 is a cross-sectional view illustrating a method of manufacturing a vertical memory device illustrated in FIGS. 11 and 12.

FIG. 13 is a cross-sectional view illustrating a method of manufacturing a vertical memory device illustrated in FIGS. 11 and 12.

First of all, a process described with reference to FIGS. 4 to 9 may be performed. Subsequently, as illustrated in FIG. 13, an epitaxial layer 160 may be formed in channel holes H1 using an SEG process. An upper surface of the epitaxial layer 160 may be disposed to be higher than a lowermost horizontal opening OP. Subsequently, an insulating layer 131 may be formed in horizontal openings OP and the channel holes H1 using an ALD process. The insulating layer 131 may include a silicon oxide. Subsequently, a plurality of gate electrode layers 133 may be formed in the horizontal openings OP.

With reference to FIGS. 11 and 12, gate dielectric layers 161 may be formed in the channel holes H1, while channel layers 163 may be formed on a side wall of the gate dielectric layers 161. The channel layers 163 may be in contact with the epitaxial layer 160. Subsequently, the insulating layers 165 filling the remainder of a space of the channel holes H1 may be formed, and drain pads 167 in contact with the channel layers 163 may be formed.

Figure 14:
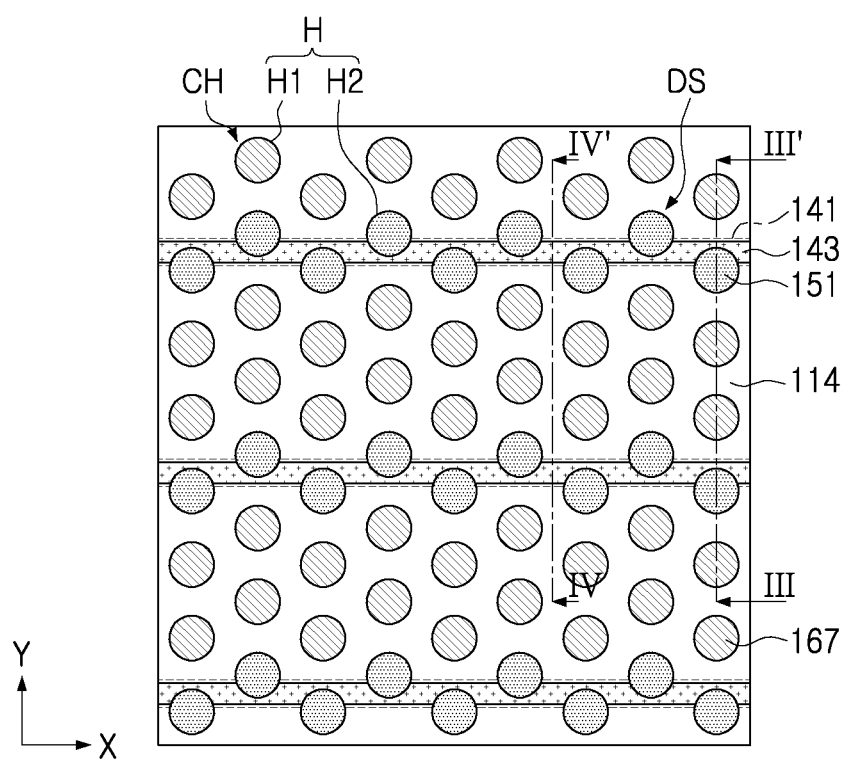
FIG. 14 is a schematic top view of a vertical memory device according to an example embodiment.
Figure 15:
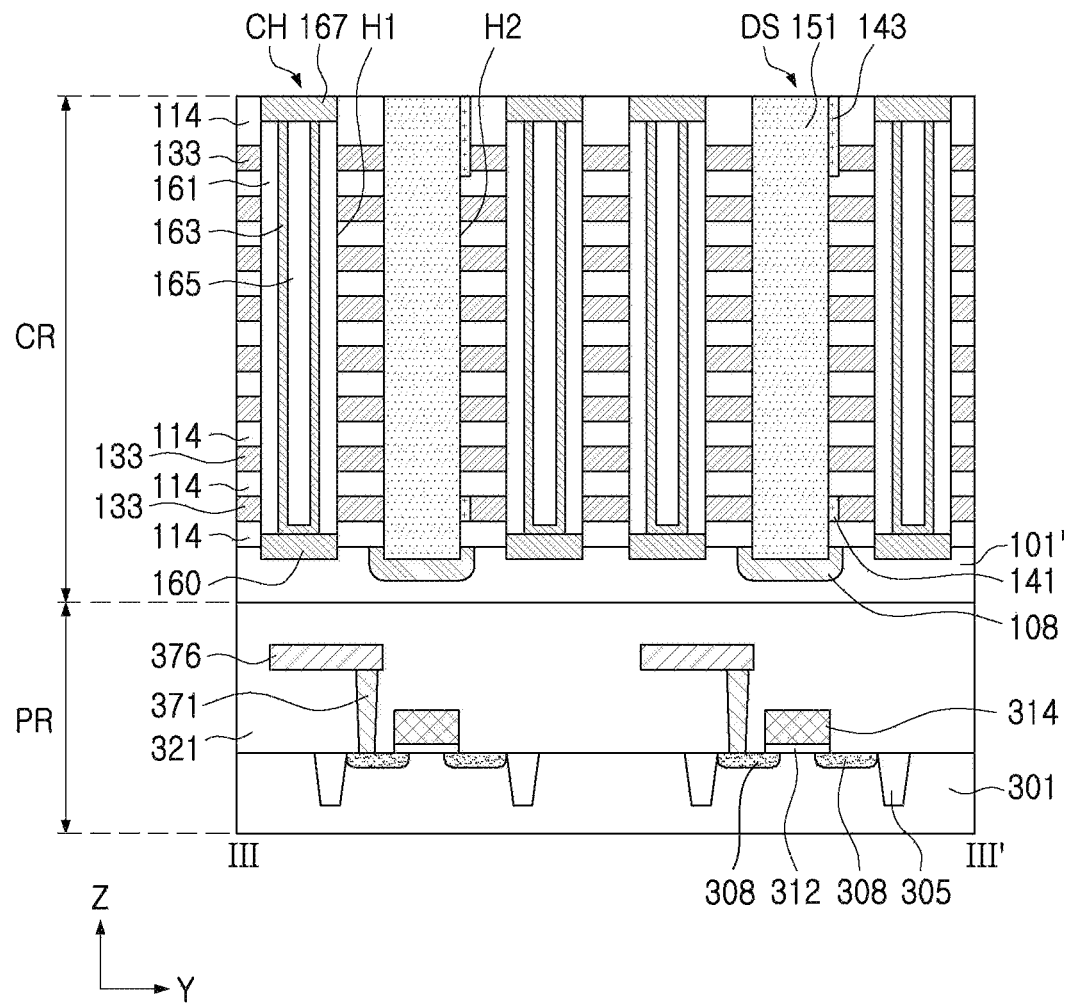
FIGS. 15 and 16 are schematic cross-sectional views of a vertical memory device according to an example embodiment.
Figure 16:
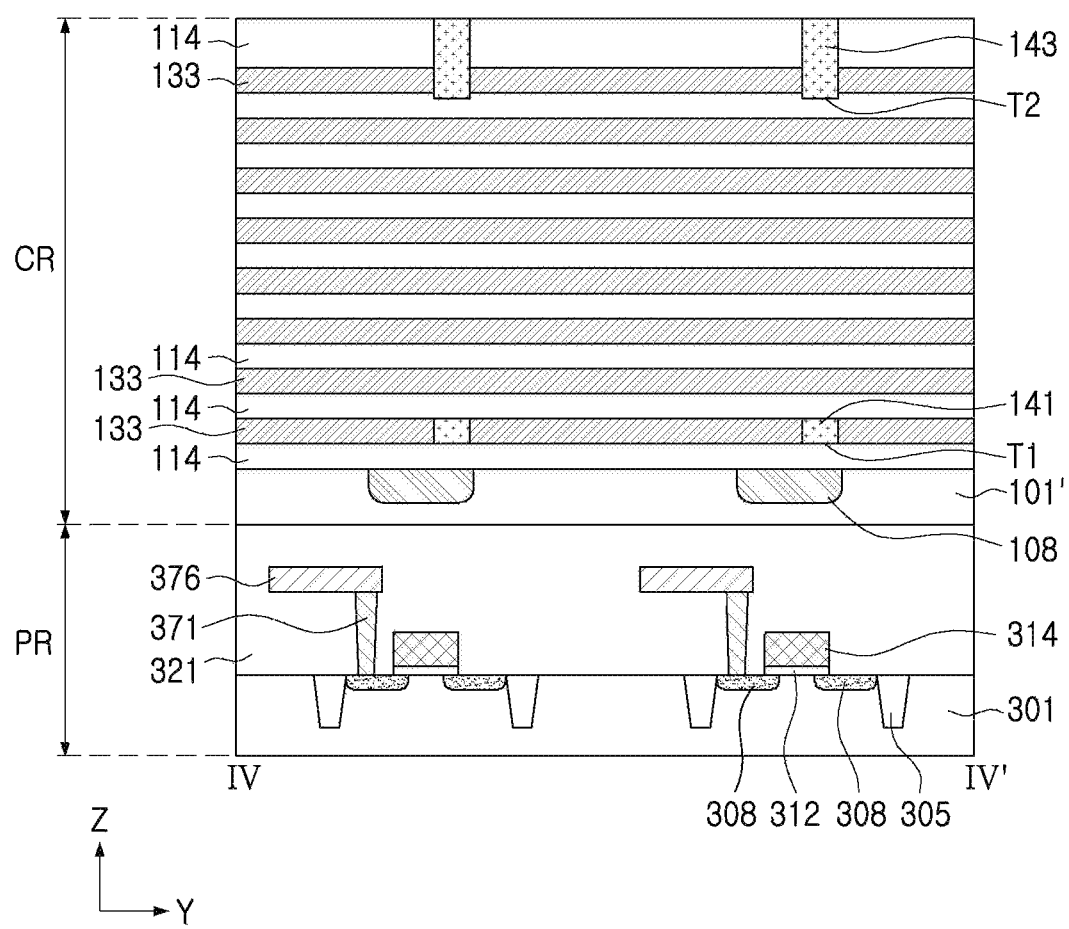

FIG. 14 is a schematic top view of a vertical memory device according to an example embodiment. FIGS. 15 and 16 are schematic cross-sectional views of the vertical memory device illustrated in FIG. 14. FIG. 15 is a cross-sectional view taken along line III-III' of FIG. 14, while FIG. 16 is a cross-sectional view taken along line IV-IV' of FIG. 14.

The vertical memory device illustrated in FIGS. 14 to 16 will be described based on a difference between the vertical memory device illustrated in FIGS. 14 to 16 and the vertical memory device illustrated in FIGS. 1 to 3.

In the case of the vertical memory device illustrated in FIGS. 14 to 16, the vertical memory device has a structure in which a peripheral circuit region PR is disposed below a cell region CR, in a manner different from the vertical memory device illustrated in FIGS. 1 to 3.

In the case of the peripheral circuit region PR, peripheral transistors including a gate insulating layer 312, a gate electrode 314, and a source/drain region 308 may be disposed on a lower semiconductor substrate 301. A contact plug 371 and a circuit wiring 376, connected to the source/drain region 308, may be disposed. The cell region CR including the semiconductor substrate 101' may be disposed on an interlayer insulating layer 321. The semiconductor substrate 101' may be formed, for example, using a polycrystalline semiconductor material.

The cell region CR may have a structure similar to that of the vertical memory device illustrated in FIGS. 1 to 3. Support structures DS disposed in first support holes H2 may only include an insulating layer 151 in contact with the semiconductor substrate 101. The first support holes H2 may be filled with only an insulating layer 151 in contact with the semiconductor substrate 101.

FIGS. 17 to 25 are schematic top views of a vertical memory device according to one or more example embodiments.

Figure 17:
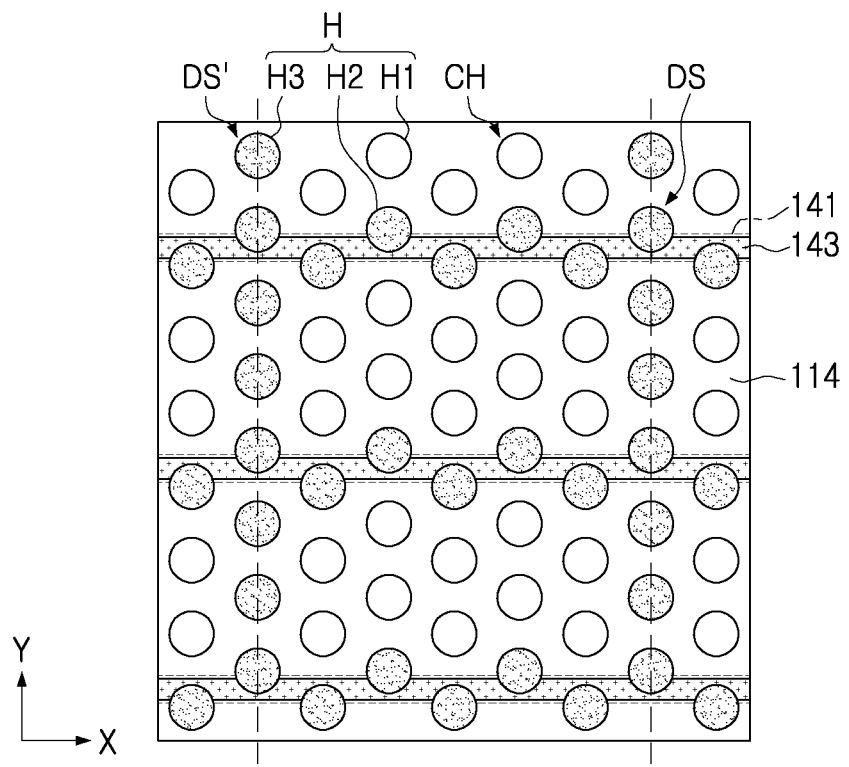
FIGS. 17 to 25 are schematic top views of a vertical memory device according to one or more example embodiments.

In a manner different from the vertical memory device illustrated in FIG. 1, the vertical memory device illustrated in FIG. 17 may include not only first support structures DS disposed in first support holes H2, but may also include second support structures DS' disposed in second support holes H3. The second support holes H3 may be disposed on virtual lines extending in a second direction (e.g., a Y-axis direction) intersecting a first direction (e.g., an X-axis direction), in which upper isolation insulating layers 143 extend.

Figure 18:
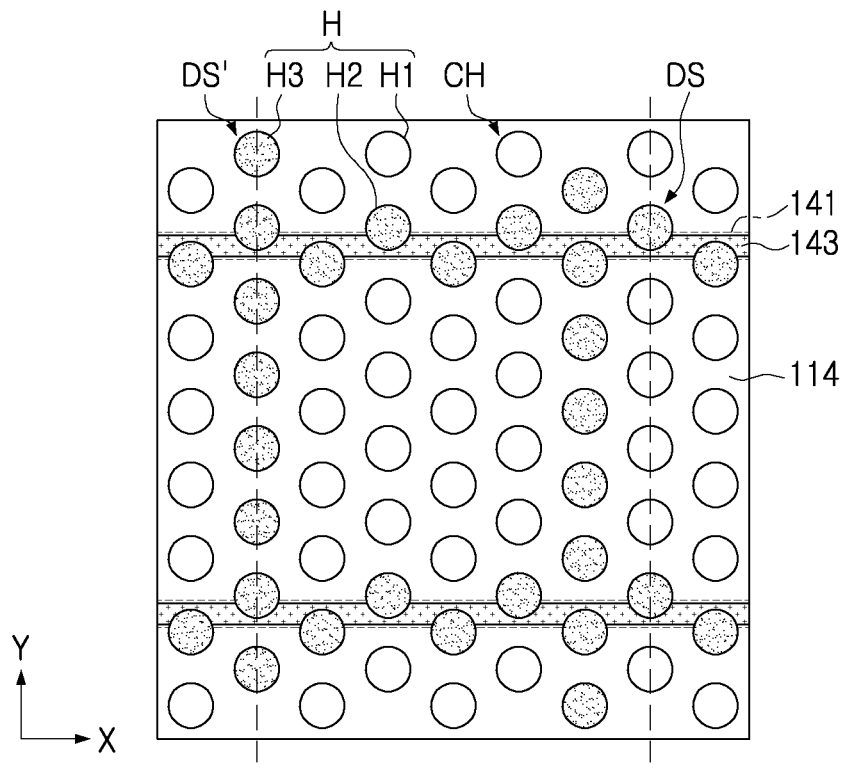

In the case of the vertical memory device illustrated in FIG. 18, the upper isolation insulating layers 143 and lower isolation insulating layers 141 may be repeatedly disposed to have a wider interval therebetween, as compared with the vertical memory device illustrated in FIG. 17. Thus, the first support structures DS may also be disposed to have a wider interval therebetween in the second direction.

Figure 19:
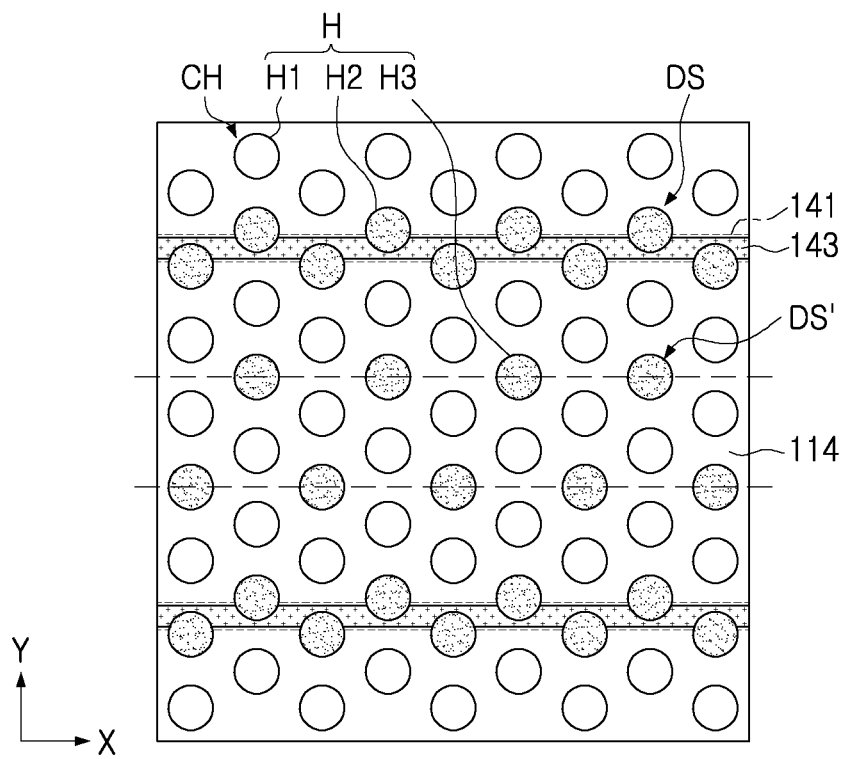

In the case of the vertical memory device illustrated in FIG. 19, the upper isolation insulating layers 143 and the lower isolation insulating layers 141 may be repeatedly arranged with a wider interval therebetween, as compared with the vertical memory device illustrated in FIG. 17. In addition, the vertical memory device illustrated in FIG. 19 may further include second support structures DS' disposed in the second support holes H3.

The second support holes H3 may be disposed between a plurality of upper isolation insulating layers and disposed on virtual lines extending in the first direction.

Figure 20:
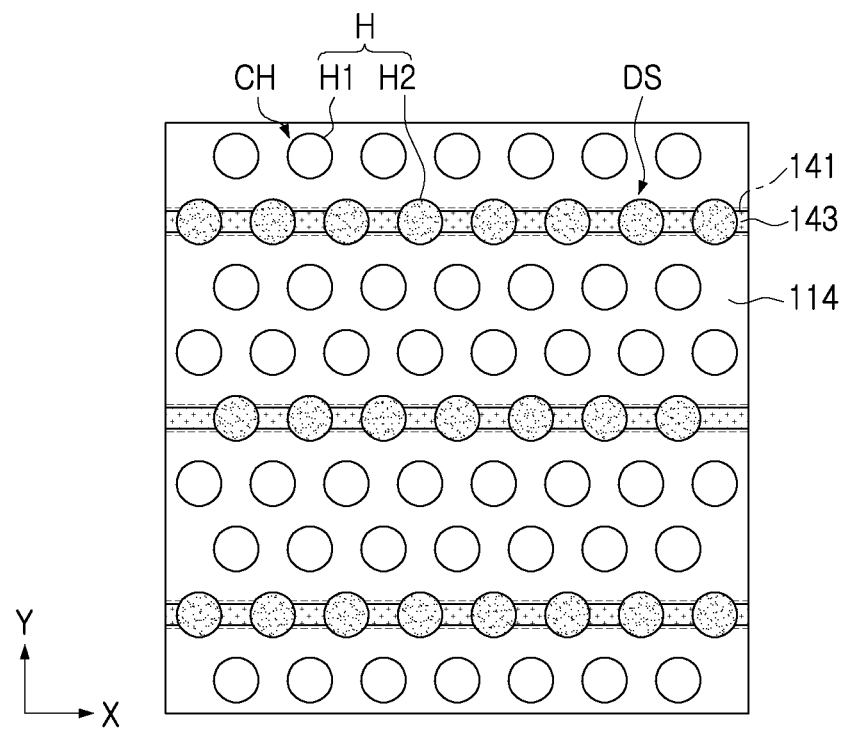

In the case of the vertical memory device illustrated in FIG. 20, a plurality of vertical holes H may be arranged to have a hexagonal packed pattern in which three vertical holes disposed adjacent to each other form vertices of an equilateral triangle. However, in a manner different from the vertical memory device illustrated in FIG. 1, the first support holes H2 of FIG. 20 may be arranged in a straight line along the upper isolation insulating layer 143. The first support structures DS may overlap the upper isolation insulating layer 143 to be disposed in a straight line.

Figure 21:
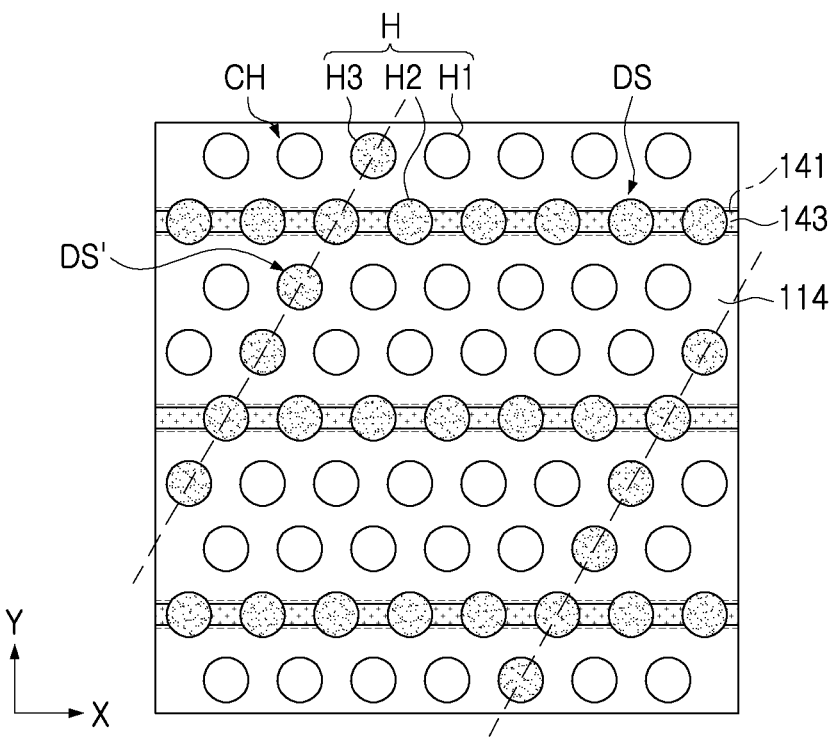

The vertical memory device illustrated in FIG. 21 may include not only the first support structures DS disposed in the first support holes H2, but may also include the second support structures DS' disposed in the second support holes H3, in a manner different from the vertical memory device illustrated in FIG. 20. The second support holes H3 may be disposed on the virtual lines extending in the second direction intersecting the first direction in which the upper isolation insulating layers 143 extend. However, the second direction in which the virtual lines extend may not necessary be perpendicular to the first direction, and may intersect the first direction at an angle other than the right angle, as illustrated in FIG. 21.

Figure 22:
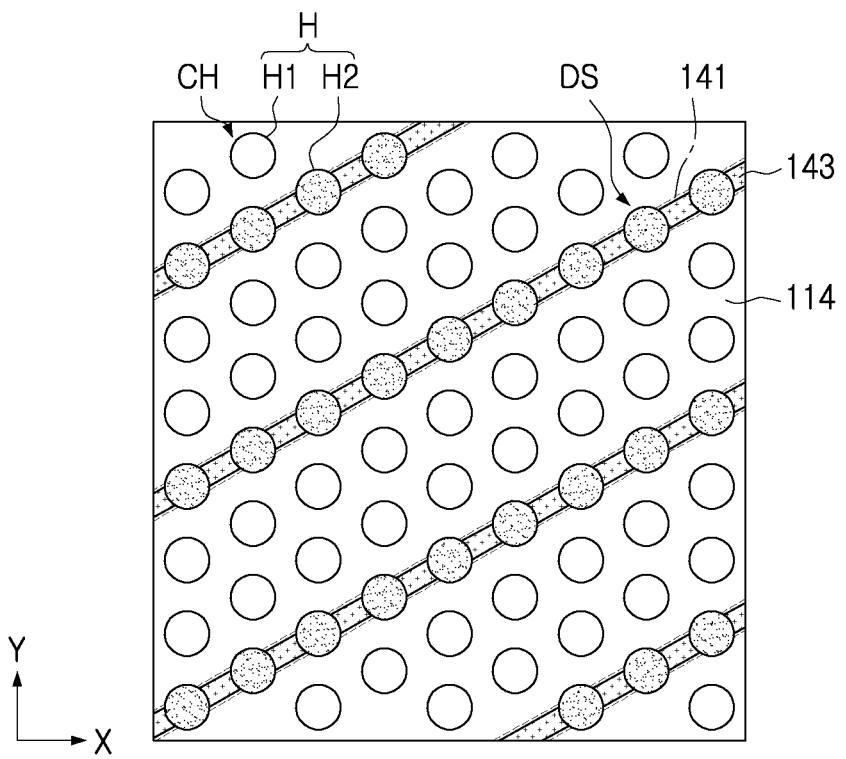

In the case of the vertical memory device illustrated in FIG. 22, the upper isolation insulating layers 143 and the lower isolation insulating layers 141 may be extending in the first direction inclined with respect to an X-axis direction and a Y-axis direction, in a manner different from the vertical memory device illustrated in FIG. 1. The first support holes H2 may be arranged in a straight line along the upper isolation insulating layer 143. The first support structures DS may overlap the upper isolation insulating layer 143 to be disposed in a straight line.

Figure 23:
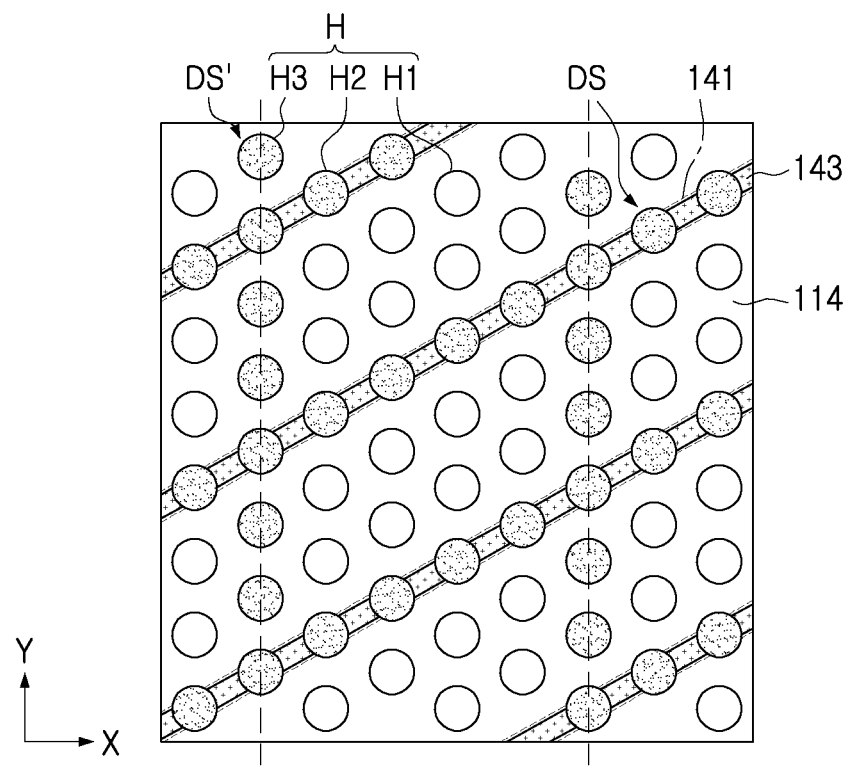

The vertical memory device illustrated in FIG. 23 may include not only the first support structures DS disposed in the first support holes H2, but may also include the second support structures DS' disposed in the second support holes H3, in a manner different from the vertical memory device illustrated in FIG. 22. The second support holes H3 may be disposed on the virtual lines extending in the second direction (e.g., the Y-axis direction) intersecting the first direction in which the upper isolation insulating layers 143 extend.

Figure 24:
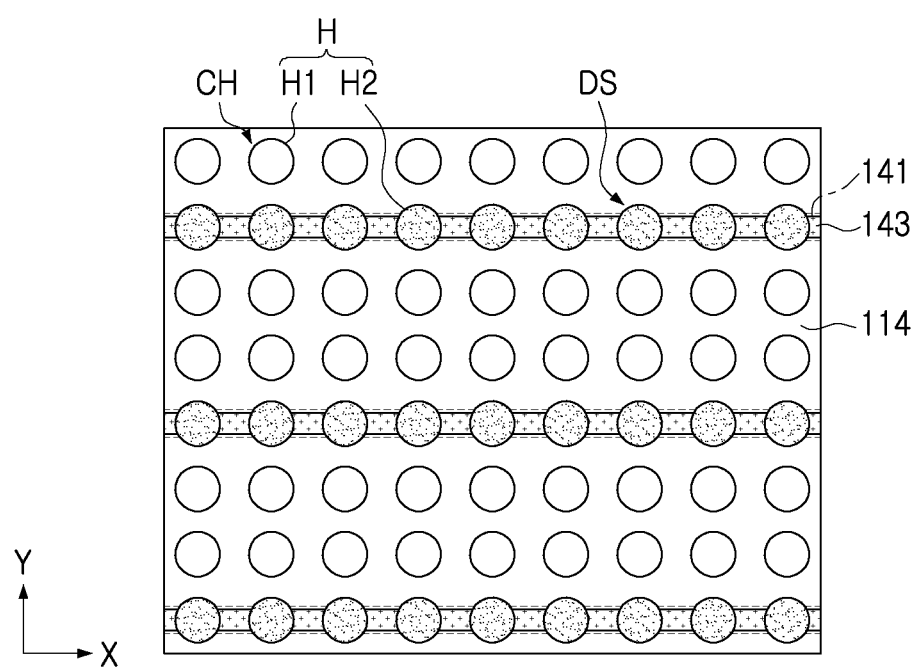

In the case of the vertical memory device illustrated in FIG. 24, the plurality of vertical holes H may be disposed to have a quadrilateral lattice pattern. The first support holes H2 may be disposed in a straight line along the upper isolation insulating layer 143. The first support structures DS may overlap the upper isolation insulating layer 143 to be disposed in a straight line.

Figure 25:
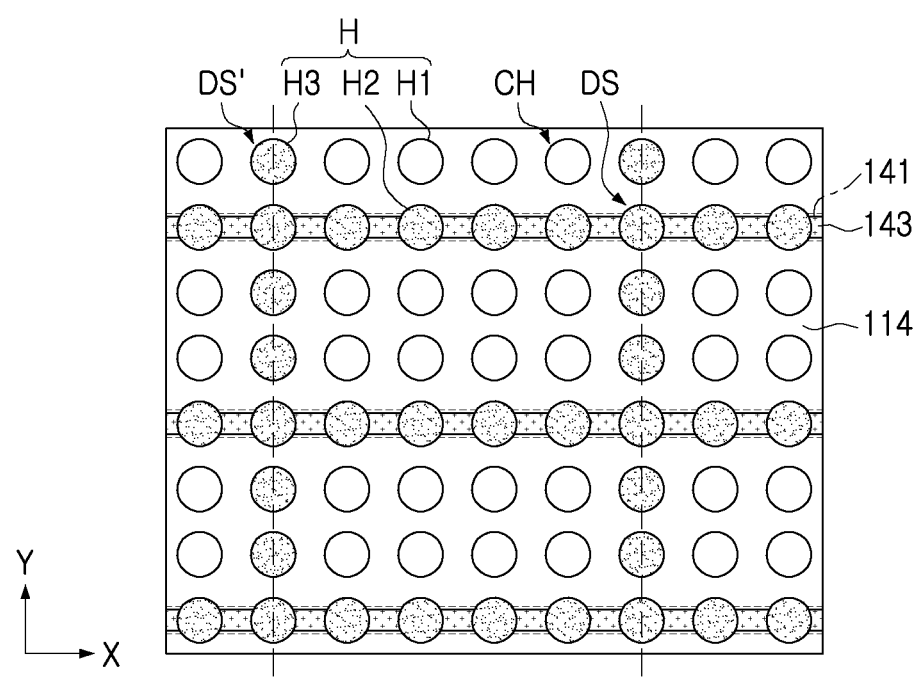

The vertical memory device illustrated in FIG. 25 may not only include the first support structures DS disposed in the first support holes H2, but may also include the second support structures DS' disposed in the second support holes H3, in a manner different from the vertical memory device illustrated in FIG. 23. The second support holes H3 may be disposed on the virtual lines extending in the second direction intersecting the first direction in which the upper isolation insulating layers 143 extend.

As set forth above, according to example embodiments of the present disclosure, a vertical memory device, in which a defect related to an etching process of channel holes is remedied, may be provided.

According to an example embodiment, a method of manufacturing a vertical memory device, in which a defect related to an etching process of channel holes is remedied, and a simplified manufacturing process are provided.

While example embodiments have been shown and described above, it will be apparent to those skilled in the art that modifications and variations could be made without departing from the scope of the present disclosure as defined by the appended claims.

What is claimed is:

1. A vertical memory device comprising:
a stacked structure including interlayer insulating layers and gate layers alternately stacked on a substrate; and
a plurality of vertical structures penetrating through the stacked structure in a vertical direction perpendicular to an upper surface of the substrate,
wherein the plurality of vertical structures comprise first vertical structures arranged in a first direction parallel to the upper surface of the substrate,
wherein any two adjacent first vertical structures of the first vertical structures arranged in the first direction have a uniform distance from each other at substantially the same level as at least one of the interlayer insulating layers,
wherein the first vertical structures comprise a first channel structure, a second channel structure, and one or more first support structures between the first channel structure and the second channel structure,
wherein each of the first and the second channel structures includes material different from the one or more first support structures, and
wherein the first channel structure, the second channel structure, and the one or more first support structures have a same diameter or width in the first direction at substantially the same level as at least one of the interlayer insulating layers.

2. The vertical memory device of claim 1, wherein the gate layers comprise a lower gate layer, a plurality of intermediate gate layers on the lower gate layer, and an upper gate layer on the plurality of intermediate gate layers.

3. The vertical memory device of claim 2, further comprising an upper isolation insulating layer dividing the upper gate layer.

4. The vertical memory device of claim 3, wherein the upper isolation insulating layer is disposed on the plurality of intermediate gate layers.

5. The vertical memory device of claim 3, wherein at least a portion of the upper isolation insulating layer is disposed between the upper gate layer and at least a portion of each of the one or more first support structures.

6. The vertical memory device of claim 3, wherein the upper isolation insulating layer extends to a second direction parallel to the upper surface of the substrate, and
wherein the first direction and the second direction are different directions.

7. The vertical memory device of claim 3, wherein the upper isolation insulating layer is spaced apart from the first and the second channel structures and is in contact with the one or more first support structures.

8. The vertical memory device of claim 3, wherein the plurality of vertical structures further comprise a second support structure, and
wherein the upper isolation insulating layer is spaced apart from the second support structure and is in contact with the one or more first support structures.

9. The vertical memory device of claim 8, wherein the one or more first support structures and the second support structure are formed of the same material.

10. The vertical memory device of claim 3, further comprising a lower isolation insulating layer dividing the lower gate layer,
wherein the lower isolation insulating layer is spaced apart from the upper isolation insulating layer in the vertical direction perpendicular to the upper surface of the substrate, and overlaps the plurality of intermediate gate layers.

11. The vertical memory device of claim 3, wherein the lower isolation insulating layer overlaps the upper isolation insulating layer.

12. The vertical memory device of claim 1, wherein upper surfaces of the first and the second channel structures are coplanar with upper surfaces of the one or more first support structures.

13. The vertical memory device of claim 1, further comprising:
a lower semiconductor substrate; and
a peripheral circuit region between the lower semiconductor substrate and the substrate.

14. The vertical memory device of claim 1, wherein each of the first and the second channel structures includes an information storage layer and a channel layer, and
wherein the one or more first support structures do not include the information storage layer and the channel layer.

15. A vertical memory device comprising: interlayer insulating layers and gate layers alternately stacked on a substrate; and
a plurality of vertical structures penetrating through the interlayer insulating layers and the gate layers in a vertical direction perpendicular to an upper surface of the substrate;
wherein the plurality of vertical structures comprise first vertical structures arranged in a first direction parallel to the upper surface of the substrate,
wherein the first vertical structures arranged in the first direction are disposed to have uniform distances among the first vertical structures at substantially the same level as at least one of the interlayer insulating layers,
wherein the first vertical structures comprise a channel structure and a first support structure,
wherein the channel structure includes material different from the first support structure,
wherein the channel structure has a substantially same shape and size as the first support structure at substantially the same level as at least one of the interlayer insulating layers when viewed in a plan view, and
wherein the channel structure and the first support structure have a same diameter or width in the first direction at substantially the same level as at least one of the interlayer insulating layers.

16. The vertical memory device of claim 15, wherein the gate layers comprise a lower gate layer, a plurality of intermediate gate layers on the lower gate layer, and an upper gate layer on the plurality of intermediate gate layers.

17. The vertical memory device of claim 16, further comprising an upper isolation insulating layer dividing the upper gate layer into a first region and a second region.

18. The vertical memory device of claim 17, wherein the first support structure is disposed between the first region and the second region, and wherein the channel structure is spaced apart from the upper isolation insulating layer.

19. A vertical memory device comprising: a stacked structure including interlayer insulating layers and gate layers alternately stacked on a substrate;

a plurality of vertical structures penetrating through the interlayer insulating layers and the gate layers in a vertical direction perpendicular to an upper surface of the substrate; and an isolation insulating layer penetrating through at least one of the gate layers, wherein the plurality of vertical structures comprise first vertical structures arranged in a first direction parallel to the upper surface of the substrate, wherein the first vertical structures comprise a channel structure and a first support structure, wherein the channel structure includes material different from the first support structure, wherein the at least one of the gate layers includes a first region and a second region, wherein the isolation insulating layer and the first support structure are disposed between the first region and the second region, wherein the channel structure is spaced apart from an upper isolation insulating layer, wherein the channel structure has a substantially same shape and width as the first support structure at substantially the same level as at least one of the interlayer insulating layers, wherein the first vertical structures arranged in the first direction are disposed to have uniform distances among the first vertical structures at substantially the same level as at least one of the interlayer insulating layers, and wherein the channel structure and the first support structure have a same diameter or width in the first direction at substantially the same level as at least one of the interlayer insulating layers.

\* \* \* \* \*